United States Patent
Chao et al.

(10) Patent No.: US 8,378,567 B2
(45) Date of Patent: Feb. 19, 2013

(54) LIGHT-POLARIZING STRUCTURE

(75) Inventors: Chia Hsin Chao, Taichung County (TW); Chun Feng Lai, Taichung County (TW); Han Tsung Hsueh, Taipei (TW); Jui Ying Lin, Taipei (TW); Wen Yung Yeh, Hsinchu County (TW); Jim Yong Chi, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 115 days.

(21) Appl. No.: 12/265,123

(22) Filed: Nov. 5, 2008

(65) Prior Publication Data

US 2009/0128004 A1 May 21, 2009

(30) Foreign Application Priority Data

Nov. 21, 2007 (TW) ............................... 96144009 A
Nov. 23, 2007 (TW) ............................... 96144420 A
Nov. 27, 2007 (TW) ............................... 96144954 A

(51) Int. Cl.
*H01J 1/62* (2006.01)
*H01L 31/12* (2006.01)

(52) U.S. Cl. .......... 313/498; 313/499; 313/506; 257/79; 257/94; 257/95; 257/98

(58) Field of Classification Search .................... 313/498
See application file for complete search history.

(56) References Cited

U.S. PATENT DOCUMENTS

| | | | | |
|---|---|---|---|---|
| 6,334,017 B1 * | 12/2001 | West | ............................... | 385/123 |
| 6,674,778 B1 * | 1/2004 | Lin et al. | ...................... | 372/46.01 |
| 6,878,969 B2 * | 4/2005 | Tanaka et al. | .................... | 257/79 |
| 7,098,589 B2 | 8/2006 | Erchak et al. | | |
| 7,105,850 B2 | 9/2006 | Wu et al. | | |
| 7,375,380 B2 * | 5/2008 | Asahara et al. | ................. | 257/98 |
| 7,483,466 B2 * | 1/2009 | Uchida et al. | .............. | 372/50.11 |
| 7,582,910 B2 * | 9/2009 | David et al. | ...................... | 257/86 |
| 7,652,295 B2 * | 1/2010 | Cho et al. | ......................... | 257/79 |
| 2004/0135155 A1 * | 7/2004 | Otsuka et al. | ................... | 257/79 |
| 2007/0036189 A1 * | 2/2007 | Hori et al. | .................. | 372/50.11 |
| 2007/0221907 A1 * | 9/2007 | Jang et al. | ......................... | 257/13 |
| 2008/0061304 A1 * | 3/2008 | Huang et al. | .................... | 257/79 |
| 2008/0117941 A1 * | 5/2008 | Nagatomo | ....................... | 372/19 |

OTHER PUBLICATIONS

Hamza Kurt, et al., "Annular photonic crystals", Optics Express, vol. 13, No. 25, 10316-10326 (2005).*
Office Action from TW counterpart application No. 096144009 dated Sep. 14, 2012 cites US 7105850B2.
Excerpt English translation of Office Action from TW counterpart application No. 096144009 dated Sep. 14, 2012.
Office Action of corresponding TIPO application No. 096144009, dated Nov. 27, 2012 cites: Liann-Be Chang et al., "Light Output Improvement of InGaN-Based Light-Emitting Diodes by Microchannel Structure".
English Abstract of Office Action of corresponding TIPO application No. 096144009, dated Nov. 27, 2012.

(Continued)

*Primary Examiner* — Sikha Roy
(74) *Attorney, Agent, or Firm* — WPAT, P.C.; Anthony King

(57) ABSTRACT

A light-emitting device comprises a substrate, at least one light-emitting structure configured to emit light beams and positioned on the substrate, and a ring-shaped photonic crystal structure positioned in the light-emitting structure. The ring-shaped photonic crystal structure includes a plurality of pillars positioned in the light-emitting structure and a plurality of ring-shaped openings surrounding the pillars. The distance between the ring-shaped openings is preferably between $0.2\lambda$ and $10\lambda$, and $\lambda$ represents the wavelength of the light beam.

10 Claims, 14 Drawing Sheets

OTHER PUBLICATIONS

Liann-Be Chang et al., "Light Output Improvement of InGaN-Based Light-Emitting Diodes by Microchannel Structure", IEEE Photonics Technology Letters, Aug. 1, 2007, vol. 19, No. 19, pp. 1175-1177.

* cited by examiner

LIGHT-POLARIZING STRUCTURE

BACKGROUND OF THE INVENTION (A) Field of the Invention

The present invention relates to a light-emitting device, and more particularly, to a light-emitting device having a ring-shaped photonic crystal structure configured to improve the light-extraction efficiency and to control the collimation property of the light beams.

(B) Description of the Related Art

The lighting efficiency of the solid-state semiconductor light-emitting devices such as the light-emitting diode (LED) is restricted to the total reflection at the interface between the internal semiconductor material and the external material such as the air or the epoxy, and only a small percentage of the total light generated in the device is emitted to the external environment.

FIG. 1 and FIG. 2 illustrate a conventional light-emitting diode 300, disclosed in U.S. Pat. No. 7,098,589. The light-emitting diode 300 includes a substrate 320 and multi-layer stack 322 positioned on the substrate 320. The multi-layer stack 322 includes a gallium nitride layer 324 having a plurality of circular openings 350. In particular, the technique disclosed in U.S. Pat. No. 7,098,589 uses the circular opening 350 to prevent the total reflection at the interface so as to improve the light-extraction efficiency. In general, a larger opening corresponds to higher light-extraction efficiency. However, a large opening negatively influences the current distribution of the light-emitting device and the lighting efficiency of the light-emitting layer, and decreases the whole light-extraction efficiency.

SUMMARY OF THE INVENTION

One aspect of the present invention provides a light-emitting device having a ring-shaped photonic crystal structure configured to improve the light-extraction efficiency by preventing the total reflection at the interface and to control the collimation property of the light beams as well.

A light-emitting device according to this aspect of the present invention comprises a substrate, at least one light-emitting structure positioned on the substrate, and a ring-shaped photonic crystal structure positioned in the light-emitting structure, wherein the ring-shaped photonic crystal structure includes a plurality of ring-shaped holes.

Another aspect of the present invention provides a light-emitting device, comprising a substrate, at least one light-emitting structure positioned on the substrate, and a light-collimating structure positioned in the light-emitting structure, wherein the light-collimating structure includes a plurality of pillars and a plurality of ring-shaped holes surrounding the pillars.

Compared to the conventional light-emitting device without the photonic crystal structure, the light-emitting device with the photonic crystal structure of the present invention possesses higher light-extraction efficiency. In addition, compared to the conventional light-emitting device with the circular holes, the light-emitting device with the ring-shaped photonic crystal structure of the present invention possesses better collimating property.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
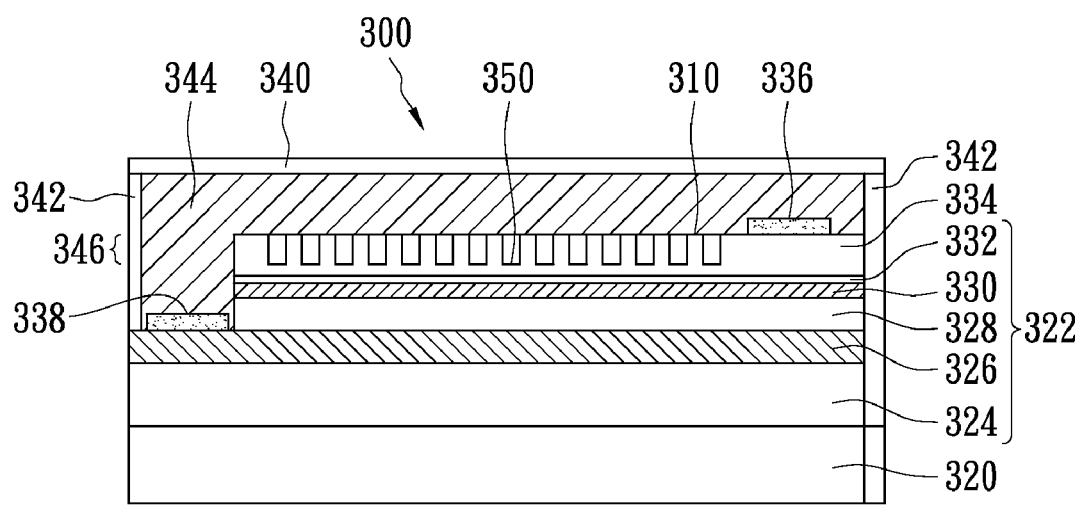
FIG. 1 and FIG. 2 illustrate a conventional light-emitting diode.
Figure 2:
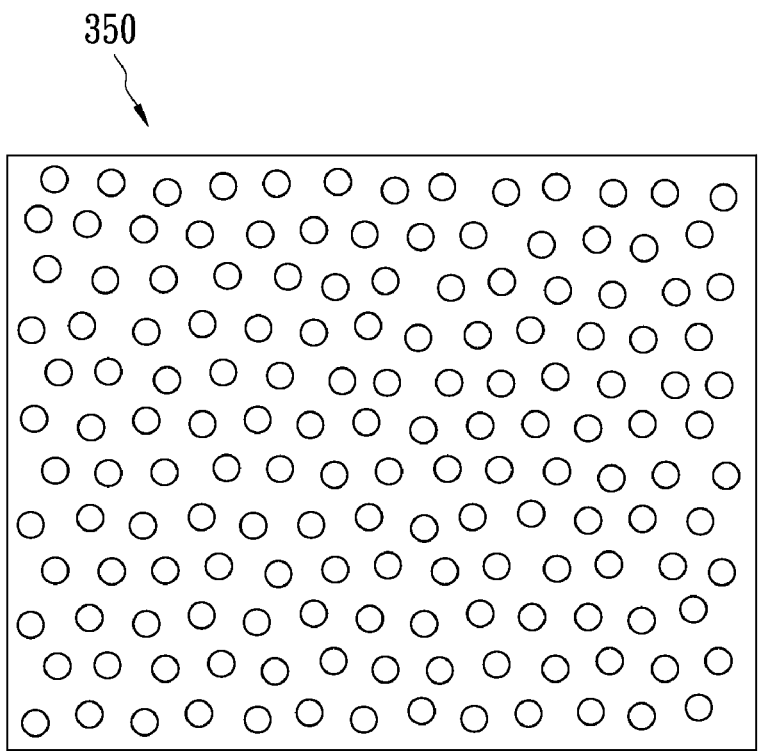
Figure 3:
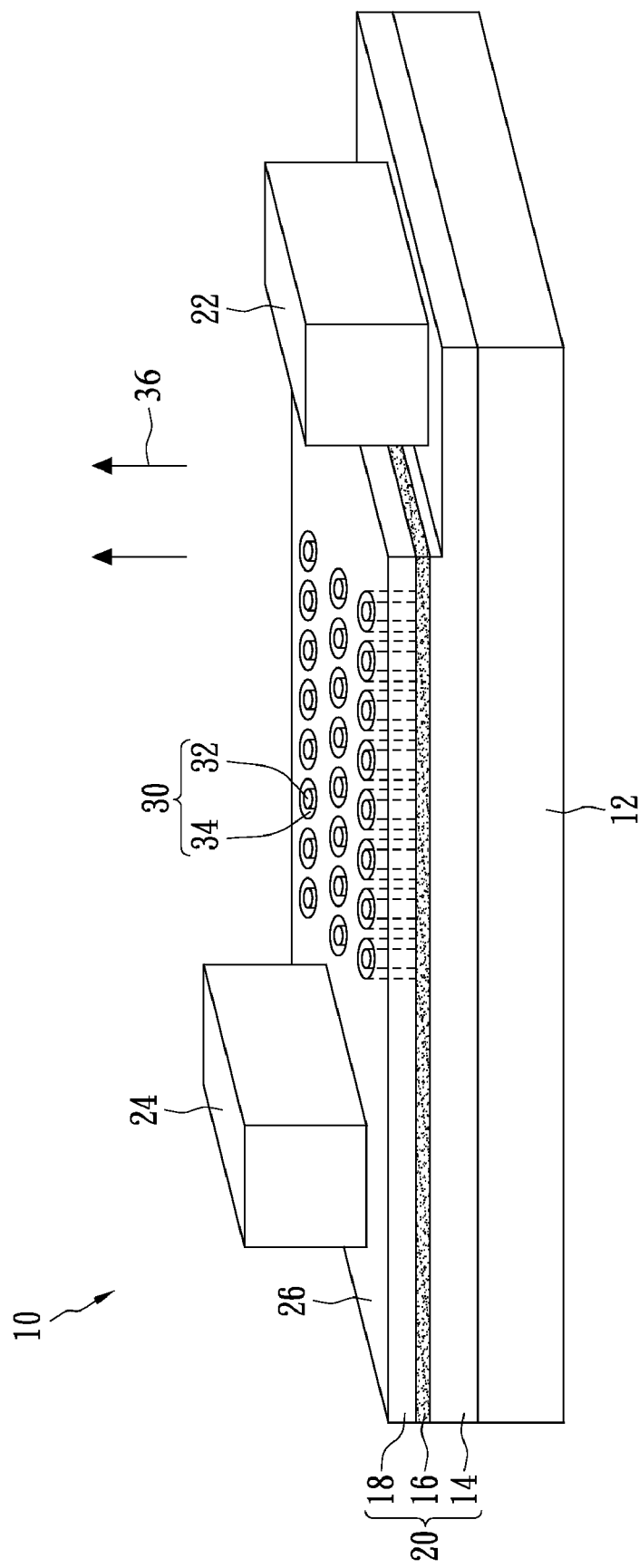
FIG. 3 and FIG. 4 illustrate a light-emitting device according to one embodiment of the present invention.
Figure 4:
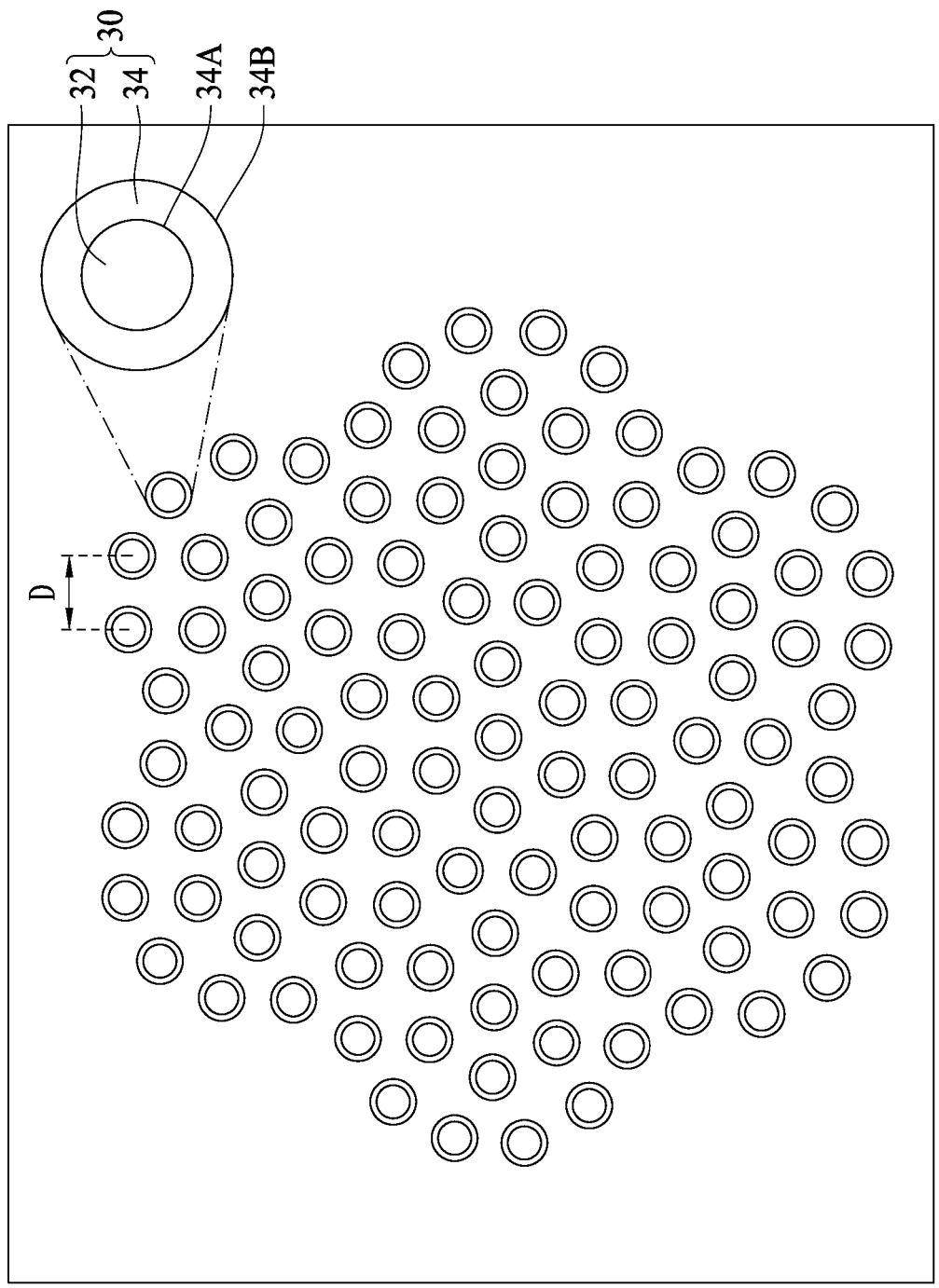

FIG. 3 and FIG. 4 illustrate a light-emitting device 10 according to one embodiment of the present invention. The light-emitting device 10 comprises a substrate 12, at least one light-emitting structure 20 positioned on the substrate 12 and configured to generate light beams 36, an n-type contact electrode 22, a p-type contact electrode 24, and a ring-shaped photonic crystal structure 30 positioned in the light-emitting structure 20. The ring-shaped photonic crystal structure 30 includes a plurality of pillars 32 positioned in the light-emitting structure 20 and a plurality of ring-shaped openings 34 surrounding the pillars 32. The light-emitting structure 20 can be a light-emitting diode or a laser diode, including at least an n-type semiconductor layer 14, a light-emitting layer 16, and a p-type semiconductor layer 18.

The light-emitting structure 20 includes a light-emitting side 26, and the ring-shaped photonic crystal structure 30 is positioned at the light-emitting side 26. The depth of the ring-shaped hole 34 is smaller than or equal to the thickness of the p-type semiconductor layer 18. The distance (D) between the ring-shaped holes 34 is between 0.2λ and 10λ, and λ represents the wavelength of the light beams 36. The pillars 32 and the ring-shaped holes 34 can be circular, i.e., the inner ring 34A and the outer ring 34B of the ring-shaped hole 34 are circular, and the ratio of the radius (R) of the outer ring 34B to the distance (D) between the ring-shaped holes 34 is preferably between 0.1 and 0.5. The ratio of the radius (R) of the inner ring 34A to the radius (r) of the outer ring 34B is larger than 0 and smaller than 1. In addition, the pillars 32 and the ring-shaped holes 34 (the inner ring 34A and the outer ring 34B) can be optionally designed to be elliptic, triangular, rectangular, or polygonal.

Figure 5:
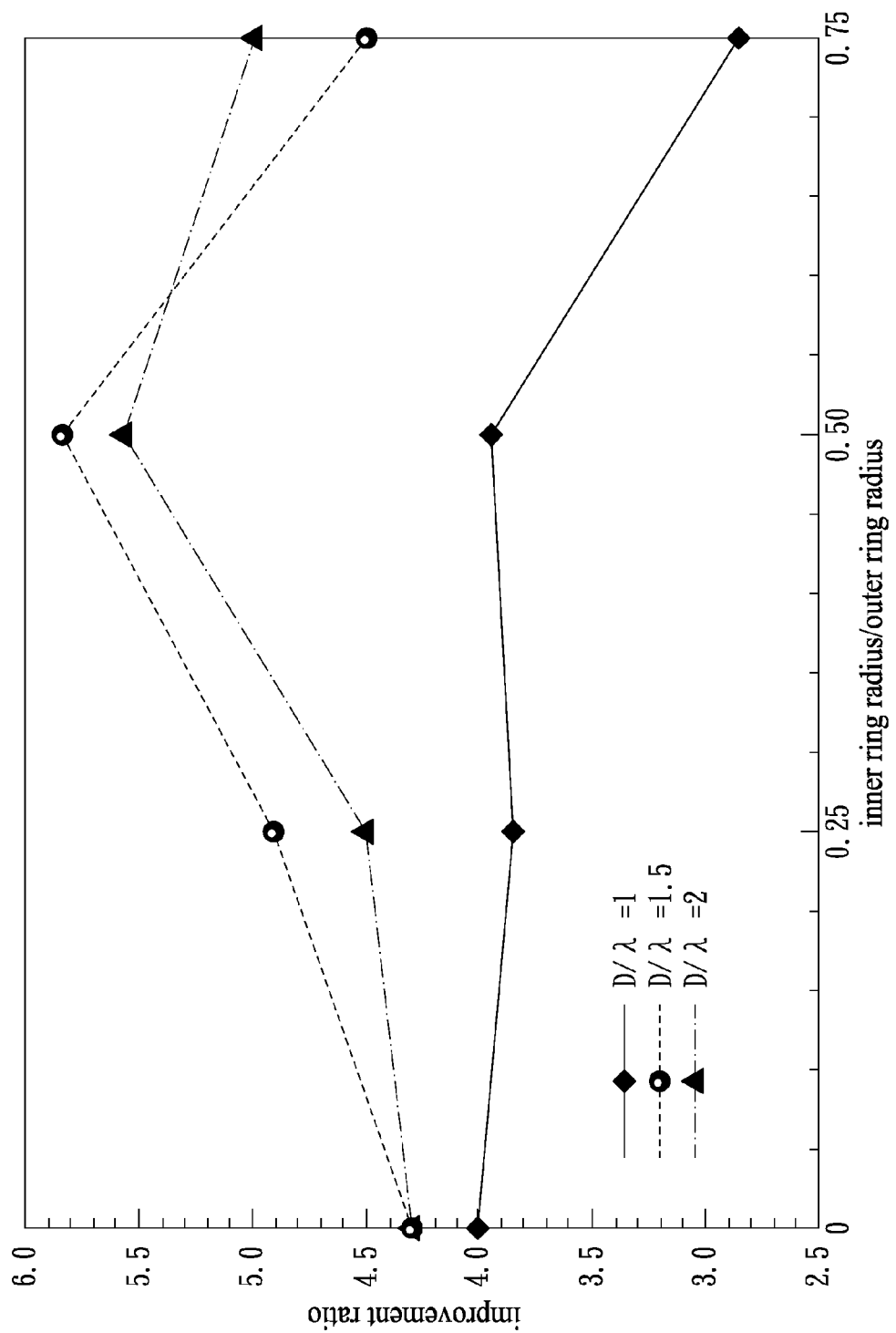
FIG. 5 illustrates the variation of the light-extraction efficiency of the light-emitting device according to one embodiment of the present invention.

FIG. 5 illustrates the variation of the light-extraction efficiency of the light-emitting device 10 according to one embodiment of the present invention. The horizontal axis represents the ratio of the radius (R) of the outer ring 34B to the radius (r) of the inner ring 34A, and the vertical axis represents the improvement ratio, the light of the light-emitting device 10 divided by the light of the conventional light-emitting device without the photonic crystal structure. The ratio (R/D) of the radius (R) of the outer ring 34B to the distance (D) between the ring-shaped holes 34 is set to be 0.45. Compared to the conventional light-emitting device without the photonic crystal structure, the light-emitting device 10 with the ring-shaped photonic crystal structure 30 obviously possesses higher light-extraction efficiency to increase the lighting intensity according to the embodiment of the present invention.

Figure 6:
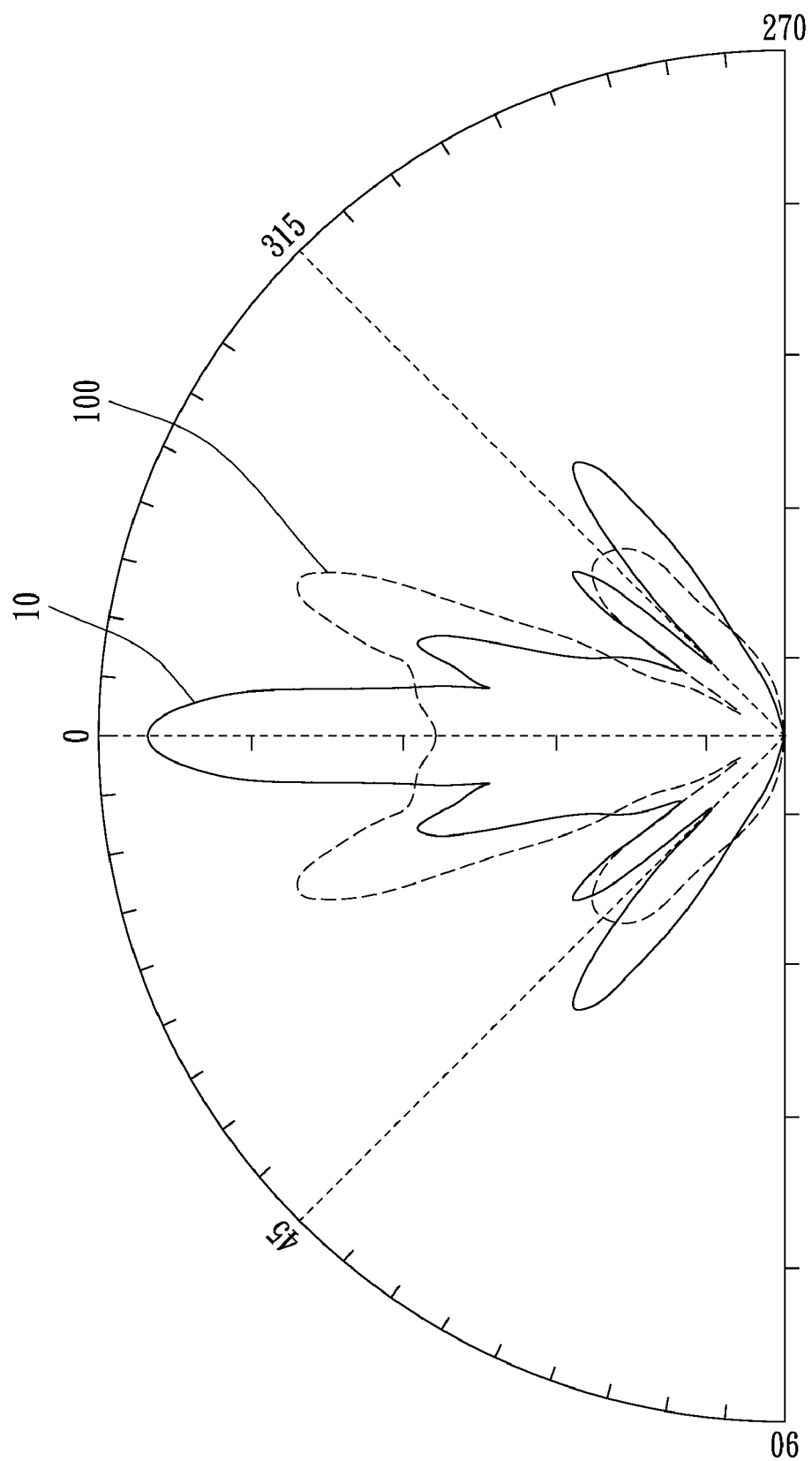
FIG. 6 illustrates the far-field shapes of the present light-emitting device and the conventional light-emitting device.

FIG. 6 illustrates the far-field shapes of the present light-emitting device 10 and the conventional light-emitting device 100. The lighting intensity of the present light-emitting device 10 between 0 and 10 degrees is obviously higher than that of the conventional light-emitting device 100, i.e., the present light-emitting device 10 has better collimating property due to the ring-shaped photonic crystal structure 30. In other words, the ring-shaped photonic crystal structure 30 can function as a light-collimating structure to improve the light-collimating property of the light-emitting device 10.

Figure 7:
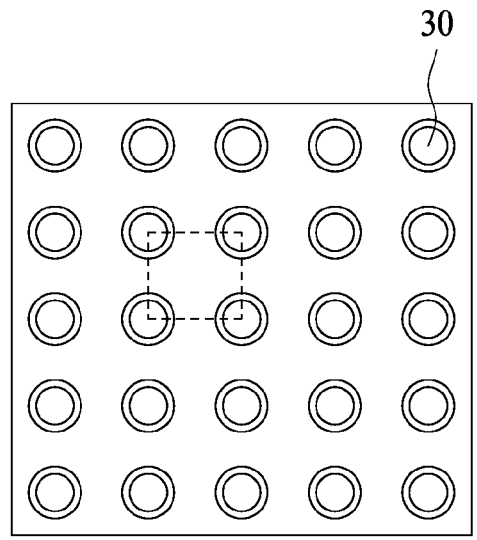
FIG. 7 to FIG. 10 illustrate the lattice of the photonic crystal structure according to the present invention.
Figure 8:
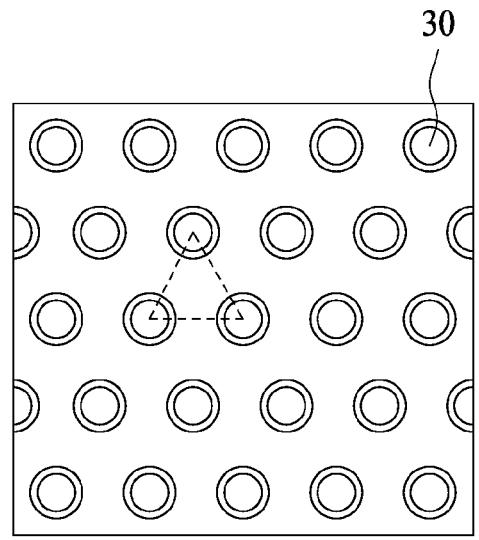
Figure 9:
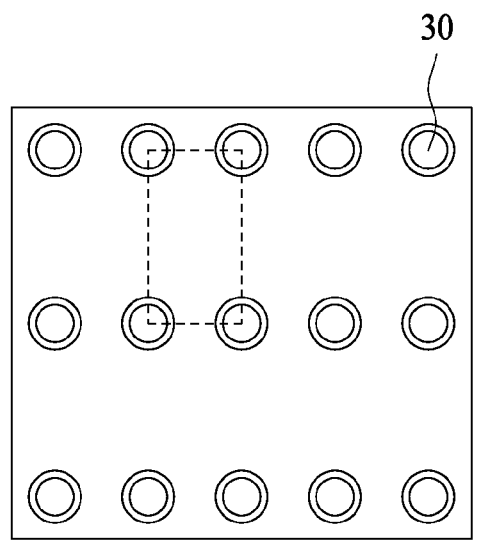
Figure 10:
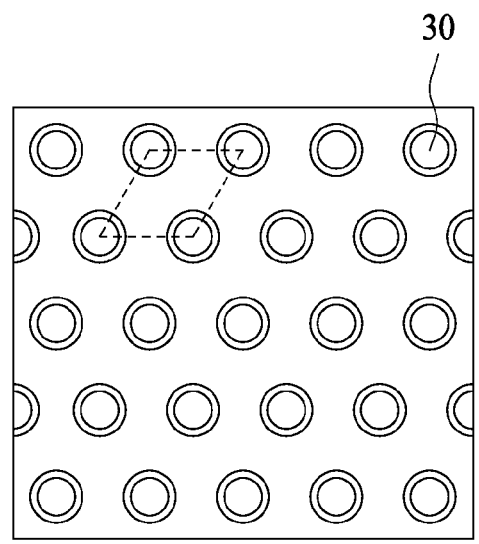

FIG. 7 to FIG. 10 illustrate the lattice of the photonic crystal structure 30, which can be square, hexagonal, or m-sided (polygonal). In addition, the lattice of the photonic crystal structure 30 can be periodic as shown in FIG. 7 to FIG. 9, quasi-periodic as shown in FIG. 10, or non-periodic.

Figure 11:
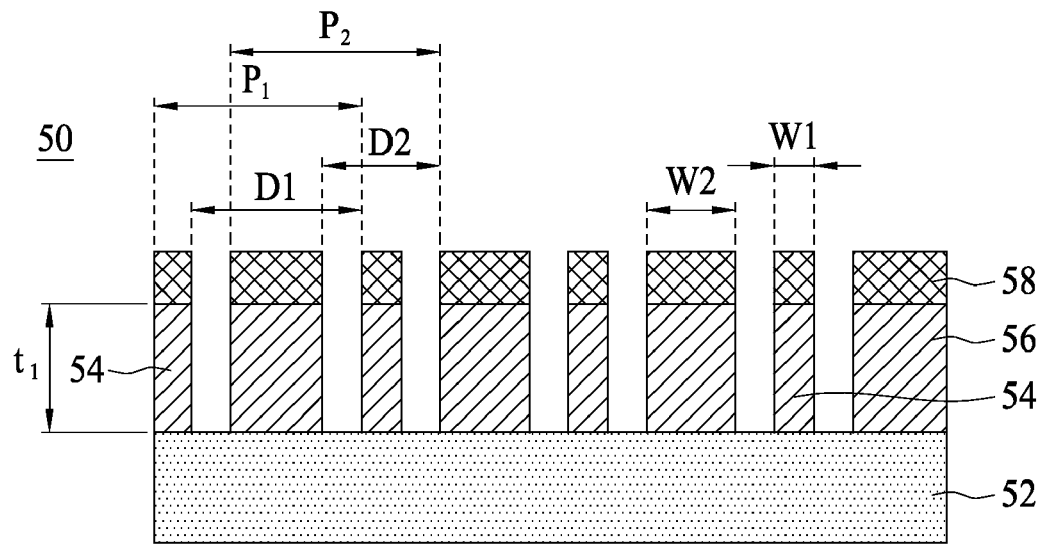
FIG. 11 illustrates a cross-sectional view of a light-polarizing structure according to one embodiment of the present invention.
Figure 12:
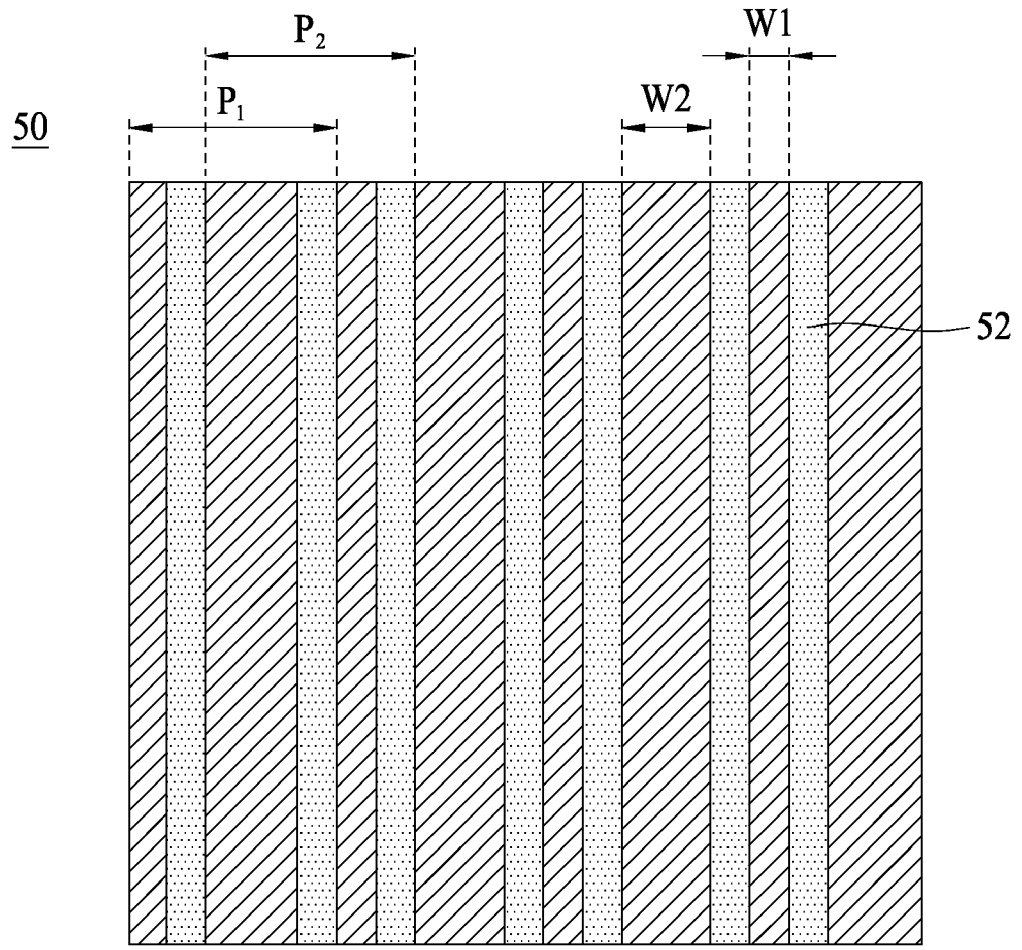
FIG. 12 illustrates a top view of the light-polarizing structure according to one embodiment of the present invention.

FIG. 11 illustrates a cross-sectional view of a light-polarizing structure 50 according to one embodiment of the present invention, and FIG. 12 illustrates a top view of the light-polarizing structure 50 according to one embodiment of the present invention. A plurality of first elongated metal layers 54 and a plurality of second elongated metal layers 56 are formed on a substrate 52. Subsequently, a cap layer 58 is formed on the first elongated metal layers 54 and the second elongated metal layers 56. In one embodiment of the present invention, the chemical vapor deposition (CVD), plasma enhanced chemical vapor deposition (PECVD), or other suitable process may be used to form a transparent dielectric layer such as $Al_2O_3$ layer on the metal layers, and the lithographic/etching process is used to strip the transparent dielectric layer so as to form the cap layer 58 on the first elongated metal layers 54 and the second elongated metal layers 56.

Please note that the refractive index (n) of the cap layer 58 is between 1.33 and 1.85, and the refractive index (n) of the cap layer 58 is preferably larger than or equal to that of the substrate 52 such that the diffraction effect of the incident lights from the substrate 52 can be increased so as to enhance the PS ratio and the transmittance (Tp) of the incident lights. In particular, the cap layer 58 also serves as a protection layer to prevent the metal layers from being oxidized. Furthermore, the thickness of the cap layer 58 may be substantially the same as that of the first elongated metal layers 54 and the second elongated metal layers 56; the aspect ratio of the first elongated metal layers 54 may be about 1.5; and the aspect ratio of the second elongated metal layers 56 may be about 1.

In addition, the stack consisting of the first elongated metal layers 54 and the cap layer 58 can be considered as a first elongated element 57, and the stack consisting of the second elongated metal layers 56 and the cap layer 58 can be considered as a second elongated element 59. The first elongated element 57 and the second elongated element 59 are formed on the substrate in an interlaced manner. Adjacent first elongated elements 57 are separated by a first distance (D1), and adjacent second elongated elements 59 are separated by a second distance (D2) smaller than the first distance (D1). Please note that the relationship between the thickness (t) of the elongated elements 57, 59 and the wavelength (λ) of the incident light may substantially be t=n×λ/4, where n represents an integer.

The first elongated elements 57 have a first width (W1), and the second elongated elements 59 have a second width (W2). In addition, the first elongated elements 57 are arranged with a first pitch (P1) on the substrate 52 in a parallel manner, and the second elongated elements 59 are arranged with a second pitch (P2) on the substrate 52 in a parallel manner, wherein the first elongated elements 57 and 59 are arranged in an interlaced manner. The relationship between the pitches P1, P2 and the wavelength (λ) of the incident light may be P1≦λ/2, P2≦λ/2, and preferably P1≦λ/4, P2≦λ/4. In addition, the relationship between the distances D1, D2 and the wavelength (λ) of the incident light may be D1≦λ/2, D2≦λ/2, and preferably D1≦λ/4, D2≦λ/4.

Figure 13:
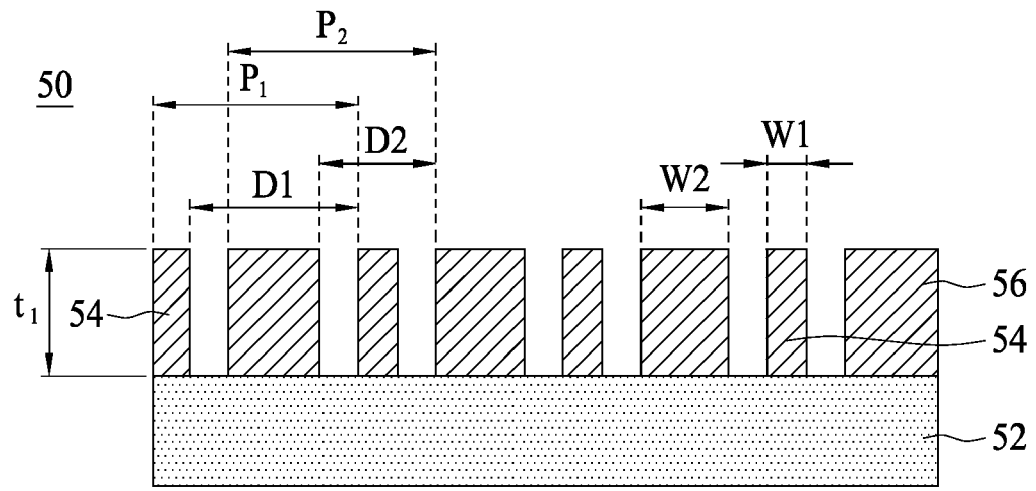
FIG. 13 illustrates a cross-sectional view of a light-polarizing structure according to one embodiment of the present invention.

FIG. 13 illustrates a cross-sectional view of a light-polarizing structure 50' according to one embodiment of the present invention. Compared to the light-polarizing structure 50 in FIG. 11, the light-polarizing structure 50' in FIG. 13 does not include a cap layer on the first elongated metal layers and the second elongated metal layers. Referring to FIG. 13, a plurality of first elongated metal layers 54 and a plurality of second elongated metal layers 56 are formed on a substrate 52, wherein the first elongated metal layers 54 have a first width (W1), and the second elongated metal layers 56 have a second width (W2) smaller than W1. In addition, the first elongated metal layers 54 and the second elongated metal layers 56 are arranged in an interlaced manner, and adjacent first elongated metal layers 54 are separated by a first distance (D1) and adjacent second elongated metal layers 56 are separated by a second distance (D2) smaller than the first distance (D1). Furthermore, the first elongated metal layers 54 are arranged with a first pitch (P1) on the substrate 52, the second elongated metal layers 56 are arranged with a second pitch (P2) on the substrate 52, and P1 is larger than P2.

Please note that the light-polarizing structure 50' includes first elongated elements having a first width (W1) and second elongated elements having a second width (W2). In addition, the first elongated elements are arranged with a first pitch (P1)

on the substrate 52 in a parallel manner, and the second elongated elements are arranged with a second pitch (P2) on the substrate 52 in a parallel manner, wherein the first elongated elements and the second elongated elements are arranged in an interlaced manner. The relationship between the pitches P1, P2 and the wavelength ($\lambda$) of the incident light may be P1$\leq\lambda/2$, P2$\leq\lambda/2$, and preferably P1$\leq\lambda/4$, P2$\leq\lambda/4$. In addition, the relationship between the distances D1, D2 and the wavelength ($\lambda$) of the incident light may be D1$\leq\lambda/2$, D2$\leq\lambda/2$, and preferably D1$\leq\lambda/4$, D2$\leq\lambda/4$.

Figure 14:
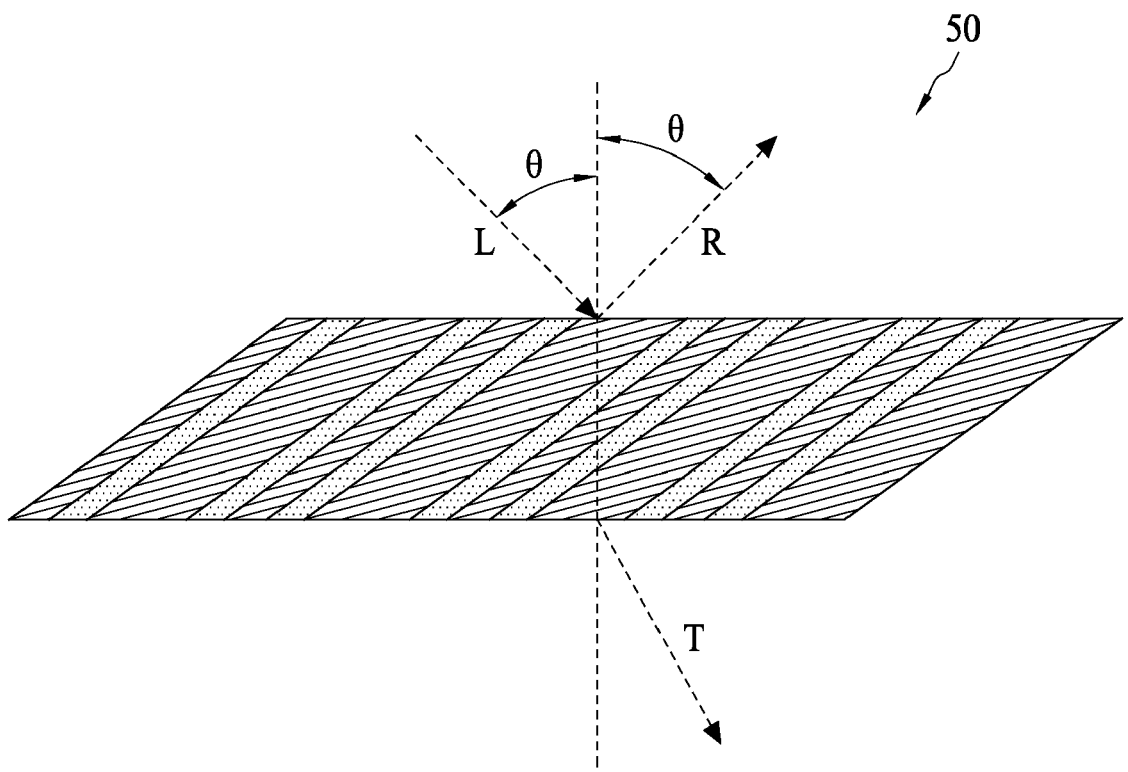
FIG. 14 illustrates a light to the light-polarizing structure according to one embodiment of the present invention.

FIG. 14 illustrates a light to the light-polarizing structure 50 according to one embodiment of the present invention. The light irradiates the light-polarizing structure 50 at an included angle ($\theta$) between the incident light (L) and the normal line. When the light (L) irradiates the light-polarizing structure 50, a portion of the light (L) is reflected, while the other portion transmits through the light-polarizing structure 50 to form a reflection light (R) and a transmitting light (T). An S-polarization light is the portion of polarization lights perpendicular to the incident plane of the incident light, while a P-polarization light is the portion of the polarization light parallel to the incident plane of the incident light. In other words, the S-polarization light is parallel to the elongated metal layers, while the P-polarization light is perpendicular to the elongated metal layers.

Figure 15:
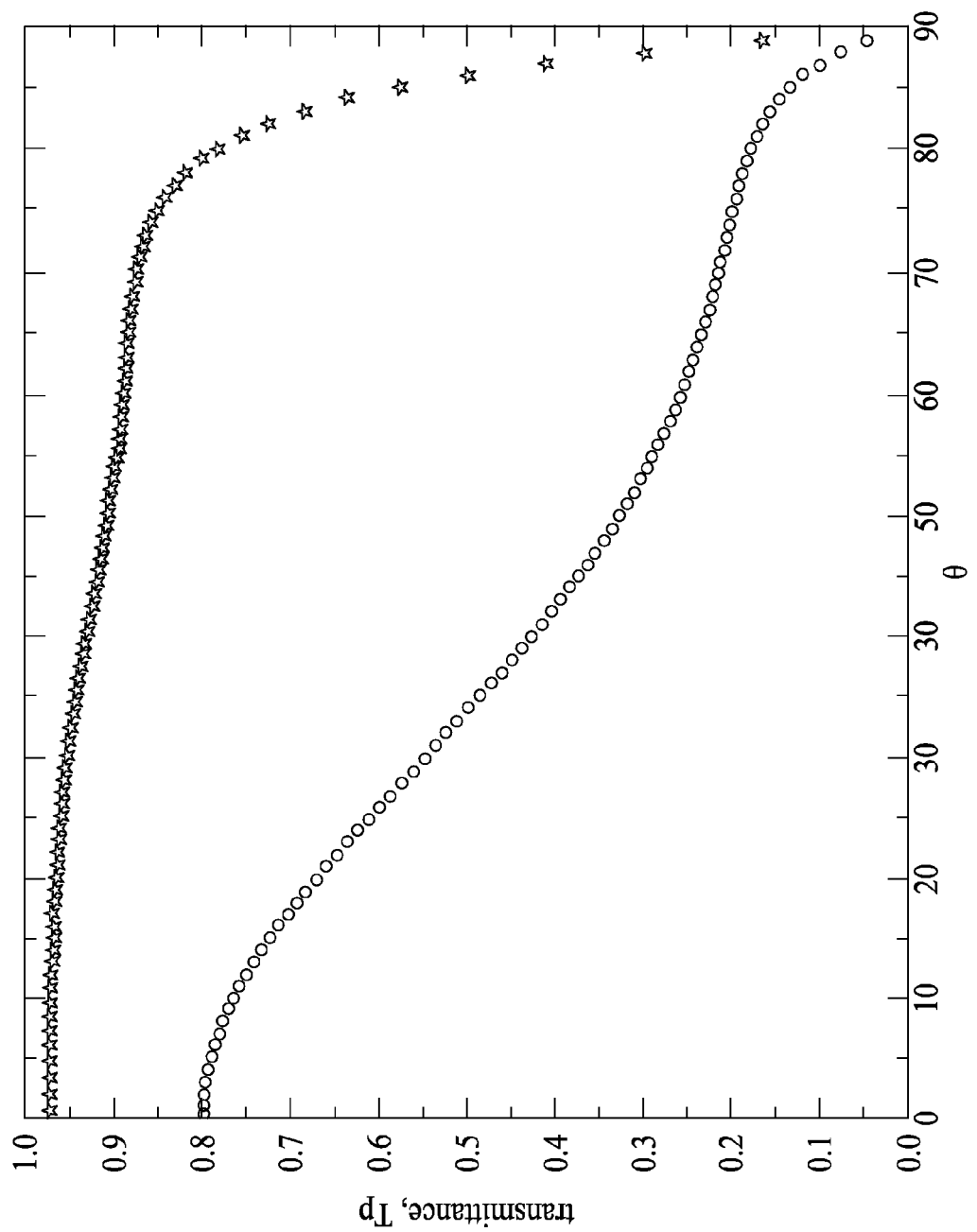
FIG. 15 and FIG. 16 illustrate the transmittance and the PS ratio of the light-polarizing structure according to one embodiment of the present invention.
Figure 16:
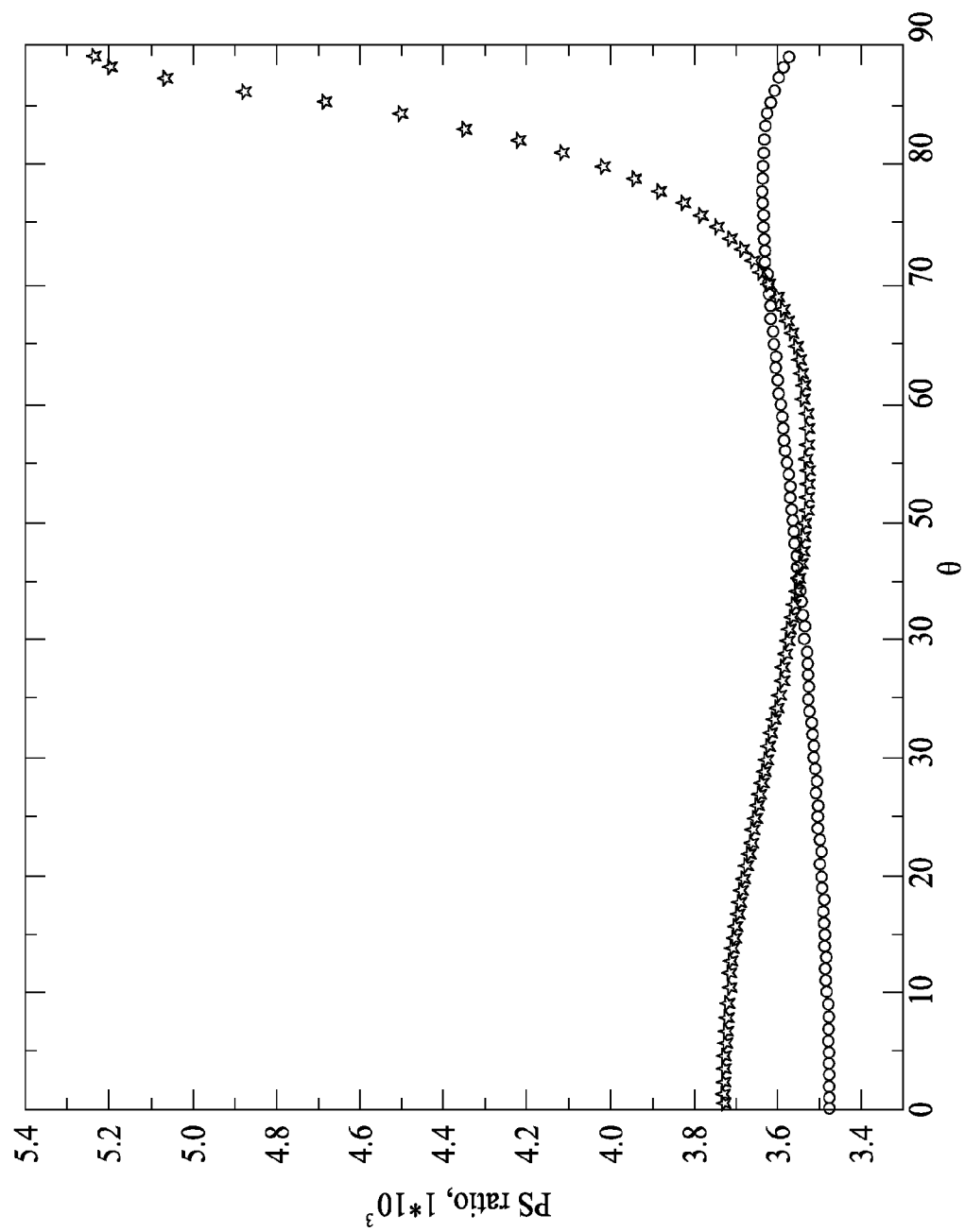

FIG. 15 and FIG. 16 illustrate the transmittance and the PS ratio of the light-polarizing structure according to one embodiment of the present invention. Aluminum and gold are used to prepare the metal layers, 460 nm wavelength light is used in the experiment, the curve with stars represents the experiment result with aluminum metal layers, and the curve with circles represents the experiment result with gold metal layer.

Referring to FIG. 15, when the incident angle ($\theta$) is 0 (vertical incidence), the transmittances of the light-polarizing structures with the aluminum metal layers and the light-polarizing structures with the gold metal layers are both higher than 0.8, and particularly the transmittance of the light-polarizing structure with the aluminum metal layers is higher than 0.95. In addition, when the incident angle ($\theta$) is between 30° and 80°, the transmittance of the light-polarizing structure with the aluminum metal layers is higher than 0.8, i.e., the present light-polarizing structure possesses a higher transmittance than the prior art even when the incident angle is larger.

Referring to FIG. 16, the PS ratio of the light-polarizing structure is larger than 3.4×10$^3$. As the incident angle ($\theta$) increases above 70°, the light-polarizing structure with the aluminum metal layers exhibits an increasing PS ratio. In other words, the present light-polarizing structure allows the P-polarization light to have a higher transmittance but reflects a greater portion of the S-polarization light. Consequently, the present light-polarizing structure possesses a relatively higher transmittance and PS ratio at larger incident angles ($\theta$) such as larger than 60°. In addition, the fabrication of the light-polarizing structure is simple and the cost thereof is relatively low.

Figure 17:
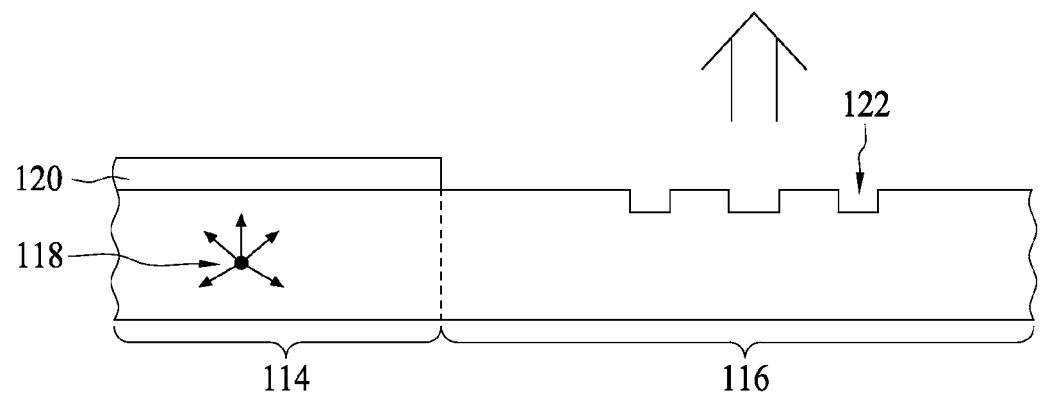
FIG. 17 illustrates the light-emitting mechanism of the light-emitting device with the waveguide polarization according to one embodiment of the present invention.

FIG. 17 illustrates the light-emitting mechanism of the light-emitting device with the waveguide polarization according to one embodiment of the present invention. The light emitted from the light source 118 in the light-emitting region 114 is guided laterally into the region 116 having the photonic crystal structure 122. In addition, a reflection layer 120 can be optionally formed on the light-emitting region 114 to avoid the light leakage and allow the reuse of the light. The light from the photonic crystal structure 122 possesses the polarization effect.

Figure 18:
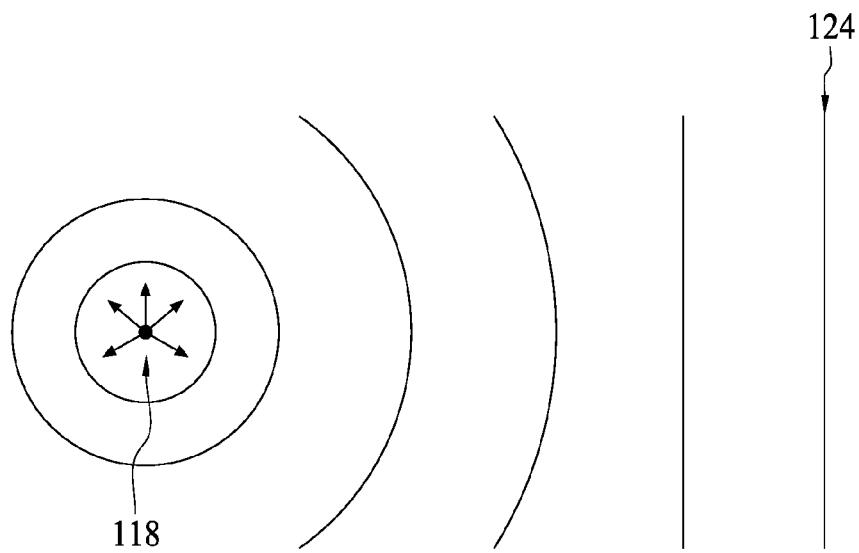
FIG. 18 illustrates the generation mechanism of the plane light.

FIG. 18 illustrates the generation mechanism of the plane light. The light emitted from the light source 118 becomes a plane light 124 after propagating a certain distance, and the plane light 124 is affected by the photonic crystal structure 122 such that the light on the region 116 possesses the polarization effect.

Figure 19:
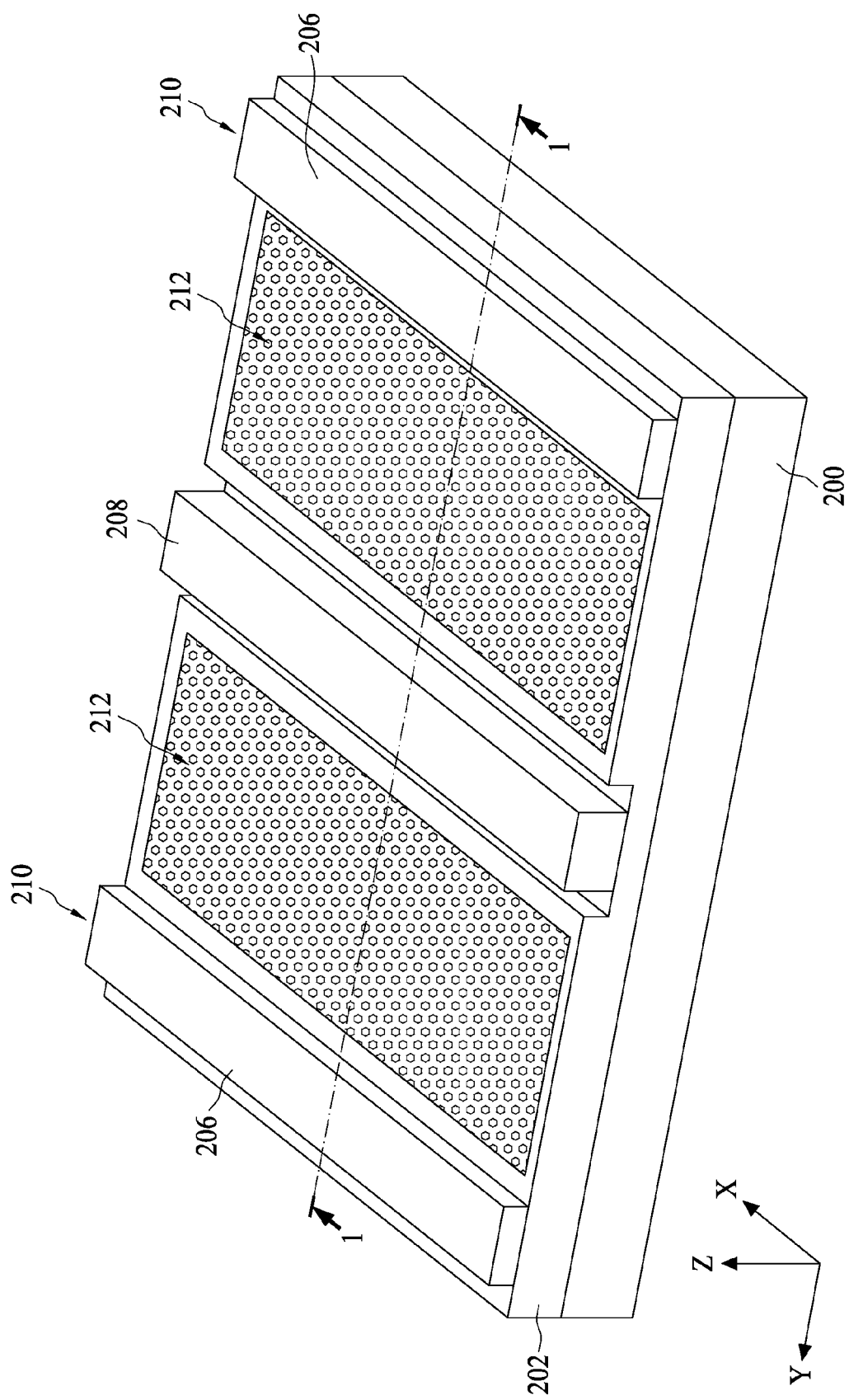
FIG. 19 illustrates a 3-D view of the light-emitting device with the waveguide polarization according to one embodiment of the present invention.

FIG. 19 illustrates a 3-D view of the light-emitting device with the waveguide polarization according to one embodiment of the present invention. The light-emitting device comprises a substrate 200, a semiconductor stack 202, a first electrode layer 206, and a second electrode layer 208. The semiconductor stack 202 includes at least a first region and a second region on the substrate 200, and the second region includes a photonic crystal structure 212. The first electrode layer 206 corresponds to the second electrode layer 208 to form a light-emitting device. In one embodiment of the present invention, the second electrode layer 208 is commonly used by two light-emitting units 210 consisting of the second electrode layer 208 and two first electrode layers 206, and the first region includes a light-emitting unit 210.

Figure 20:
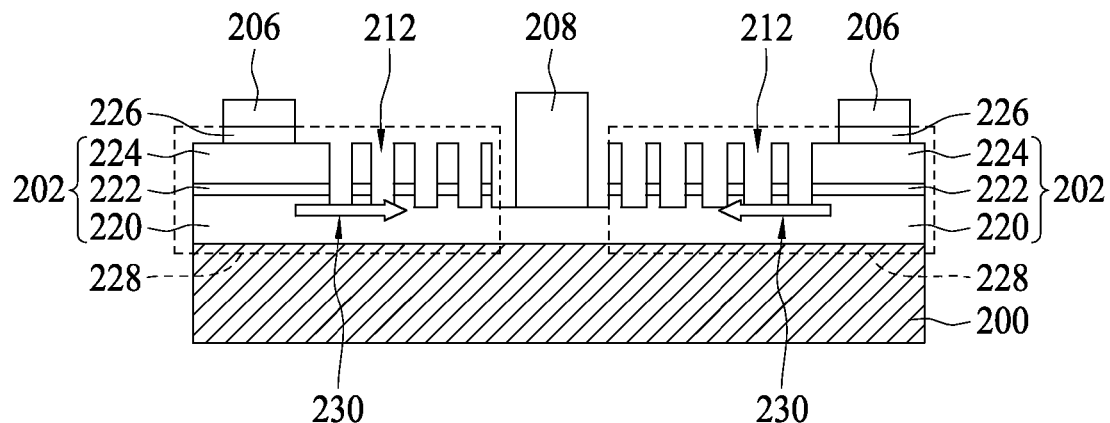
FIG. 20 illustrates a cross-sectional view along the cross-sectional line I-I in FIG. 19.

FIG. 20 illustrates a cross-sectional view along the cross-sectional line I-I in FIG. 19. The semiconductor stack 202 such as a light-emitting diode structure includes an active light-emitting layer 222, a first conductive type semiconductor layer 220 and a second conductive type semiconductor layer 224. The first conductive type semiconductor layer 220 can be an n-type semiconductor layer, while the second conductive type semiconductor layer 224 can be a p-type semiconductor layer. Alternatively, the first conductive type semiconductor layer 220 can be a p-type semiconductor layer, while the second conductive type semiconductor layer 224 can be an n-type semiconductor layer. The electrodes 206 and 208 are formed on the corresponding conductive type semiconductor layer. The corresponding electrode can be formed on the same surface or on the different surfaces of the light-emitting chip, the active layer is between the n-type semiconductor layer and the p-type semiconductor layer, and current injected from the electrode enables the active layer to emit light. The semiconductor stack structure is formed on the substrate 200, and the material can be III-V material or silicon, such as n-GaN and p-GaN semiconductor material. The material of the substrate 200 can be glass, metal, sapphire, crystal, SiC, Si, GaAs, GaP, or AlN.

In addition, an ohmic contact layer 226 may be formed on the semiconductor stack structure 202, for example, between the electrode layer 206 and the second conductive type semiconductor layer 224. The electrode layer 208 is disposed on the first conductive type semiconductor layer 220 of the semiconductor stack structure 202. Consequently, applying a forward bias to the electrode layers 206 and 208 enables the light-emitting diode to emit lights, which are then guided by the waveguide structure 228 to the photonic crystal structure 212.

The photonic crystal structure 212, including holes formed in the semiconductor stack structure 202, can be prepared by the lithographic/etching processes. The waveguide structure 228 can guide the light along a waveguide direction to the photonic crystal structure 212. The electrode layer 208 and the two electrode layers 206 at two sides form two light-emitting devices to increase the extracted light.

As to the fabrication processes such as the forming of the epitaxy structure including the n-GaN 220, the active layer and the p-GaN 224, the distance between the n-GaN 220 and the substrate 200 is smaller than that between the p-GaN 224 and the substrate 200, and the active layer 222 is between the n-GaN 220 and the p-GaN 224. As to the photonic crystal structure, material such as SiOx or SiNx is formed on the p-GaN 224 by CVD, the lithographic process such as the interference lithography, e-beam lithography, or photolithography after coating the photoresist on the material is performed to form the pattern of the photonic crystal structure in the photoresist. Subsequently, the etching process is performed to transfer the pattern of the photonic crystal structure to the material formed by the CVD, and another etching process is then performed to transfer the pattern to the GaN stack structure, wherein the etching process may be performed to etch through the active layer 222 or not to etch through the active layer 222. Consequently, the photonic crystal structure 212 is formed in the light-emitting diode, and the lateral dimension of the photonic crystal structure region can be 90 micrometers. Finally, p-type and n-type pads are formed on the p-GaN and n-GaN, serving as the electrode layers 206 and 208. During the forming of the photonic crystal structure pattern in the photoresist, the p-type electrode region can be reserved by the lithography process in which no photonic crystal structure exist, a transparent ohmic contact layer 226 such as NiO or Ni/Au can be formed between the p-type electrode and the p-GaN.

When the active layer 222 emits lights below the p-type electrode 206, the different refractive index of the interface causes the light to reflect such that waveguide modes are formed in the epitaxy structure or the substrate, which serves as the waveguide structure 228. In case of fabricating the photonic crystal structure in the substrate, the waveguide mode in the substrate can be extracted by the photonic crystal structure. Since the majority of the light emitted by the active layer 222 is TE mode and the polarization direction of the propagating light along y-axis in the waveguide structure is on the x-axis (TEx light), the photonic crystal structure can extract the light and maintain its polarization direction on the x-axis as the light propagates in the photonic crystal structure region. Consequently, the light-emitting diode exhibits the polarization capability.

In addition, the pattern of the photonic crystal structure 212 can be square, hexagonal, rectangular, periodic quasi-periodic, or non-periodic. The structure of crystal unit of the photonic crystal structure 212 can be pillar-shaped, cone-shaped, continuously concave and convex, discontinuously concave or convex, or the combination thereof, except the hole-shaped. The cross-sectional shape of the crystal unit can be polygonal, circular, or elliptical.

Figure 21:
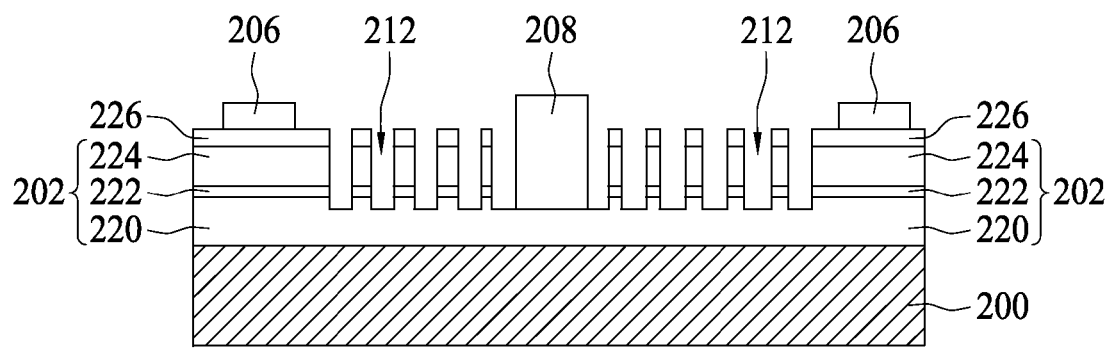
FIG. 21 illustrates a cross-sectional view of the light-emitting device with the waveguide polarization according to one embodiment of the present invention.

FIG. 21 illustrates a cross-sectional view of the light-emitting device with the waveguide polarization according to one embodiment of the present invention. To increase the intensity of the emitting light by increasing the emitting surface of the light-emitting diode, the transparent ohmic contact layer 226 may extend to the surface of the p-GaN 224 of the photonic crystal structure region. The light-emitting device in FIG. 21 is similar to that in FIG. 20, except the ohmic contact layer 226 extends to the photonic crystal structure 212. In other words, the photonic crystal structure 212 also emits light. In addition, incorporating the thickness and size design of the epitaxy structure such that the active layer can only emit the light with a specific polarization light mode, the light-emitting diode can even emit the polarization light at high intensity.

Furthermore, the mode number of the waveguide structure is determined by several parameters. For example, the mode number of a symmetric waveguide structure with thickness (d) is:

$$M = 2 \times (d/\lambda_0) \times NA$$

where $\lambda_0$ represents the wavelength of the light in vacuum, and NA represent the numerical aperture.

Figure 22:
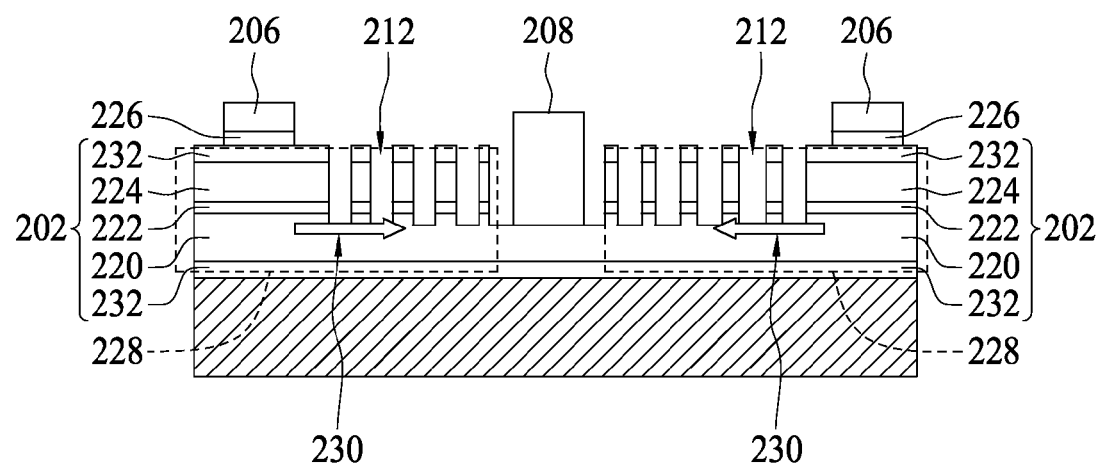
FIG. 22 illustrates a cross-sectional view of the light-emitting device with the waveguide polarization according to one embodiment of the present invention.

FIG. 22 illustrates a cross-sectional view of the light-emitting device with the waveguide polarization according to one embodiment of the present invention. To enhance the waveguide effect to increase the light along the y-axis, the Distributed Bragg Reflector (DBR) structure can be incorporated in the light-emitting diode. When the active layer 222 emits light below the p-type electrode 206, the DBR structure 232 forces the majority of the light to propagate along the y-axis, and the polarization direction of the light propagating along the y-axis is on the axis (TEx light). As the light propagates to the photonic crystal region, the photonic crystal structure extracts the light and maintains its polarization direction on the x-axis. As the amount of the light propagating along the y-axis increases, the intensity of the polarization light of the light-emitting diode increases correspondingly.

Figure 23:
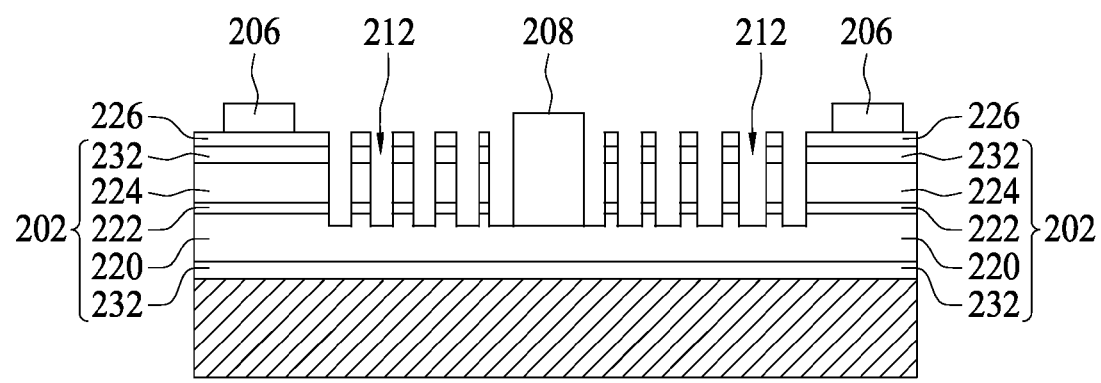
FIG. 23 illustrates a cross-sectional view of the light-emitting device with the waveguide polarization according to one embodiment of the present invention.

FIG. 23 illustrates a cross-sectional view of the light-emitting device with the waveguide polarization according to one embodiment of the present invention. To increase the intensity of the emitting light by increasing the emitting surface of the light-emitting diode, the transparent ohmic contact layer 226 may extend to the surface of the DBR structure 232 on the photonic crystal region. In other words, the entire active layer 222 under the ohmic contact layer 226 can emit light. In addition, incorporating the thickness and size design of the epitaxy structure such that the active layer can only emit the light with a specific polarization light mode, the light-emitting diode can even emit the polarization light at high intensity. Furthermore, adding a reflection structure such as a photonic crystal structure with reflection property on the opposite side of the waveguide can decrease the loss of the light through the side surface and increase the amount of the light propagating along the waveguide direction.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting device, comprising:
   a substrate;
   at least one light-emitting structure positioned on the substrate, wherein the light-emitting structure includes a p-type semiconductor layer; and
   a light-collimating structure positioned in the p-type semiconductor layer of the light-emitting structure, the light-collimating structure includes a plurality of pillars and a plurality of ring-shaped holes surrounding the pillars, wherein the depth of the ring-shaped hole is smaller than or equal to the thickness of the p-type semiconductor layer.

2. The light-emitting device of claim 1, wherein the light-emitting structure is a light-emitting diode or a laser diode.

3. The light-emitting device of claim 1, wherein the distance between the ring-shaped holes is between $0.2\lambda$ and $10\lambda$, the light-emitting structure is configured to emit light beams, and $\lambda$ represents the wavelength of the light beams.

4. The light-emitting device of claim 1, wherein the ring-shaped holes are arranged in a periodic, quasi-periodic, or non-periodic manner.

5. The light-emitting device of claim 1, wherein the ring-shaped holes are arranged in a square, hexagonal, or polygonal manner.

6. The light-emitting device of claim 1, wherein the ring-shaped hole includes an inner ring and an outer ring, and the inner ring and the outer ring are circular, elliptic, triangular, or polygonal.

7. The light-emitting device of claim 1, wherein the pillars and the ring-shaped holes are circular, the ring-shaped hole includes an outer radius, and the ratio of the outer radius to the distance between the ring-shaped holes is between 0.1 and 0.45.

8. The light-emitting device of claim 1, wherein the light-emitting structure includes a light-emitting side, and the light-collimating structure is positioned at the light-emitting side.

9. The light-emitting device of claim 1, wherein the pillars and the ring-shaped holes are circular, the ring-shaped hole includes an outer radius and an inner radius, and the ratio of the inner radius to the outer radius is larger than 0.4 and smaller than 0.6.

10. The light-emitting device of claim 1, wherein the ring-shaped holes having a bottom inside the p-type semiconductor layer.

* * * * *